United States Patent
Kim et al.

(10) Patent No.: US 12,246,362 B2
(45) Date of Patent: Mar. 11, 2025

(54) DEPOSITION MASK CLEANING APPARATUS AND DEPOSITION MASK CLEANING METHOD

(71) Applicant: Samsung Display Co., LTD., Yongin-si (KR)

(72) Inventors: Jai Phoong Kim, Asan-si (KR); Hyuk Kang, Cheonan-si (KR); Chang Uk An, Cheonan-si (KR); Jae Min Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/477,038

(22) Filed: Sep. 16, 2021

(65) Prior Publication Data
US 2022/0219208 A1    Jul. 14, 2022

(30) Foreign Application Priority Data

Jan. 14, 2021    (KR) .................. 10-2021-0005118

(51) Int. Cl.
*B08B 3/08*    (2006.01)
*B08B 3/04*    (2006.01)
(Continued)

(52) U.S. Cl.
CPC .............. *B08B 3/08* (2013.01); *B08B 3/044* (2013.01); *B08B 3/14* (2013.01); *H10K 71/00* (2023.02);
(Continued)

(58) Field of Classification Search
None
See application file for complete search history.

(56) References Cited

U.S. PATENT DOCUMENTS

2006/0054191 A1*  3/2006  Higuchi ............ H01L 21/67057
                                                    134/34
2019/0039101 A1*  2/2019  Bourdat ............ H01L 21/67051

FOREIGN PATENT DOCUMENTS

CN       110813888        2/2020
CN       111112215    *   5/2020
(Continued)

OTHER PUBLICATIONS

Translation of JP2008-211145 by Takako Sakai, published Sep. 11, 2008.*

(Continued)

*Primary Examiner* — Mikhail Kornakov
*Assistant Examiner* — Ryan L Coleman
(74) *Attorney, Agent, or Firm* — KILE PARK REED & HOUTTEMAN PLLC

(57) ABSTRACT

Provided are a deposition mask cleaning apparatus and a deposition mask cleaning method. The deposition mask cleaning apparatus includes a treated water bath containing treated water in which a deposition mask is immersed; a treated water generation part supplying the treated water to the treated water bath; a treated water supply pipe connecting the treated water bath and the treated water generation part; and a bubble generation part disposed in the treated water supply pipe and generating bubbles in the treated water. The treated water includes at least one of ozone water, hydrogen water, ammonia hydrogen water, and carbonated water. The bubbles include at least one of microbubbles having a bubble diameter of about 50 μm or less and nanobubbles having a bubble diameter of about 1 μm or less.

15 Claims, 14 Drawing Sheets

(51) Int. Cl.
  *B08B 3/14* (2006.01)
  *H10K 71/00* (2023.01)
  *H10K 71/16* (2023.01)

(52) U.S. Cl.
  CPC ...... *H10K 71/166* (2023.02); *B08B 2203/005* (2013.01)

(56) References Cited

FOREIGN PATENT DOCUMENTS

| | | | |
|---|---|---|---|
| CN | 111889443 | * | 11/2020 |
| JP | 2006-147617 | | 6/2006 |
| JP | 2006289183 | * | 10/2006 |
| JP | 2008-211145 | * | 9/2008 |
| JP | 2010-194995 | * | 9/2010 |
| JP | 4952297 | | 6/2012 |
| KR | 10-0719602 | | 5/2007 |
| KR | 10-0728218 | | 6/2007 |
| KR | 101264795 | * | 5/2013 |
| KR | 10-1534832 | | 7/2015 |
| WO | WO2013-058023 | * | 4/2013 |
| WO | WO2020-235381 | * | 11/2020 |

OTHER PUBLICATIONS

Translation of WO2020-235381 by Kagawa et al., published Nov. 26, 2020.*
Translation of WO2013-058023 by Junichi Tanaka, published Apr. 25, 2013.*
Translation of CN111112215 by Du et al., published May 8, 2020.*
Translation of JP2010-194995 by Naganori Ohama, published Sep. 9, 2010.*
Translation of KR10-0728218 by Han et al., published Jun. 13, 2007.*
Translation of CN111889443 by Zhang, published Nov. 6, 2020.*
Translation of JP2006289183 by Takahashi, published Oct. 26, 2006.*
Translation of KR101264795 by Jung, published May 15, 2013.*

* cited by examiner

DEPOSITION MASK CLEANING APPARATUS AND DEPOSITION MASK CLEANING METHOD

CROSS-REFERENCE TO RELATED APPLICATION(S)

This application claims priority to and benefit of Korean Patent Application No. 10-2021-0005118 under 35 U.S.C. § 119, filed on Jan. 14, 2021, in the Korean Intellectual Property Office, the entire contents of which are incorporated herein by reference.

BACKGROUND

1. Technical Field

The disclosure relates to a deposition mask cleaning apparatus and a deposition mask cleaning method.

2. Description of the Related Art

Display devices are becoming increasingly important with the development of multimedia. Accordingly, various types of display devices such as liquid crystal displays (LCDs), organic light emitting diodes (OLEDs), and quantum-dot light emitting displays (QLEDs) are being used.

In a display device implemented as an OLED, organic layers such as an organic light emitting layer, a planarization layer and an insulating layer constituting an organic light emitting display panel are made of an organic material with poor chemical resistance. Therefore, the organic layers may be formed not through a conventional photolithography process but through a deposition process using a deposition mask, for example, a fine meal mask (FMM).

During the deposition process, foreign matter, for example, an organic material used in the deposition process, or a cleaning material may remain on the surface of a deposition mask. Therefore, cleaning the deposition mask is required.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a deposition mask cleaning apparatus and a deposition mask cleaning method which can effectively clean foreign matter remaining on a deposition mask.

However, aspects of the disclosure are not restricted to the one set forth herein. The above and other aspects of the disclosure will become more apparent to one of ordinary skill in the art to which the disclosure pertains by referencing the detailed description of the disclosure given below.

An embodiment of a deposition mask cleaning apparatus may comprise a treated water bath containing treated water in which a deposition mask is immersed, a treated water generation part supplying the treated water to the treated water bath, a treated water supply pipe connecting the treated water bath and the treated water generation part, and a bubble generation part disposed in the treated water supply pipe and generating bubbles in the treated water. The treated water may comprise of at least one of ozone water, hydrogen water, ammonia hydrogen water, and carbonated water. The bubbles may comprise at least one of microbubbles having a bubble diameter of about 50 μm or less and nanobubbles having a bubble diameter of about 1 μm or less.

In an embodiment, the deposition mask cleaning apparatus may further comprise at least one of a nozzle disposed in the treated water bath and connected to the treated water supply pine, and a spray part disposed in the treated water bath.

In an embodiment, the deposition mask cleaning apparatus may further comprise a deionized water supply part supplying deionized water to the treated water generation part, a treatment gas generation part supplying a treatment gas to the treated water generation part, a concentration measurement part disposed in the treated water supply pipe and measuring the concentration of a treatment material in the treated water flowing in the treated water supply pipe.

In an embodiment, the treated water bath may comprise a treatment bath containing the treated water, an outer bath disposed above the treatment bath, and a cover part covering an upper part of the outer bath.

In an embodiment, the bubbles may comprise first bubbles of a first size and second bubbles of a second size. The first bubbles and the second bubbles may be simultaneously supplied into the treated water bath.

In an embodiment, the bubbles may comprise first bubbles of a first size and second bubbles of a second size. The first bubbles and the second bubbles may be sequentially supplied into the treated water bath.

In an embodiment, the first bubbles may be supplied into the treated water bath for a first time period. The second bubbles may be supplied into the treated water bath for a second time period different from the first time period.

In an embodiment, the bubble generation part may comprise a bubble size varying part which varies sizes of the bubbles.

In an embodiment, the deposition mask cleaning apparatus may further comprise an organic solvent bath containing a cleaning solution, and a deionized water bath containing deionized water.

In an embodiment, the treated water bath, the organic solvent bath, and the deionized water bath may be sequentially arranged in the order of the organic solvent bath, the treated water bath, and the deionized water bath.

In an embodiment, the treated water bath, the organic solvent bath, and the deionized water bath may be sequentially arranged in the order of the organic solvent bath, the deionized water bath, and the treated water bath.

In an embodiment, the treated water bath, the organic solvent bath, and the deionized water bath may be sequentially arranged in the order of the treated water bath, the organic solvent bath, and the deionized water bath.

In an embodiment, the deposition mask cleaning apparatus may further comprise a volatile organic solvent bath which contains a volatile organic solvent.

In an embodiment, the deposition mask may comprise a fine metal mask for manufacturing an organic light emitting display panel, and an open mask for manufacturing an organic light emitting display panel.

In an embodiment, the deposition mask may comprise a frame part including an opening, first stick parts disposed across the opening of the frame part, second stick parts disposed across the opening of the frame part and intersecting the first stick parts, and a metal film part disposed on the first stick parts and the second stick parts, the metal film part covering the opening of the frame part.

In an embodiment, the treated water and the bubbles may clean foreign matter on the deposition mask. The foreign matter may include an organic material.

An embodiment of a deposition mask cleaning method may comprise of immersing a deposition mask in a cleaning solution, immersing the deposition mask in treated water including bubbles, immersing the deposition mask in deionized water, and drying the deposition mask.

In an embodiment, the deposition mask may comprise a fine metal mask for manufacturing an organic light emitting display panel, and an open mask for manufacturing an organic light emitting display panel.

In an embodiment the bubbles may comprise at least one of microbubbles having a bubble diameter of about 50 μm or less and nanobubbles having a bubble diameter of about 1 μm or less.

In an embodiment, the deposition mask cleaning method may further comprise of immersing the deposition mask in a volatile organic solvent before the drying of the deposition mask.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
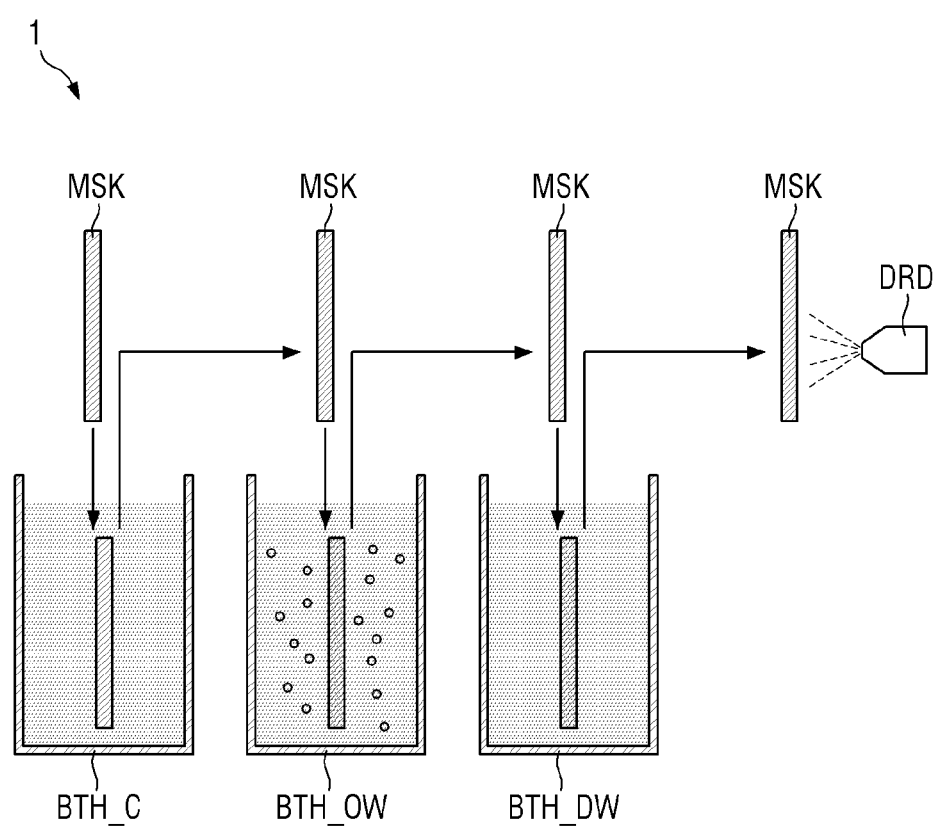
FIG. 1 is a schematic cross-sectional view of a deposition mask cleaning apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "face" and "facing" mean that a first element may directly or indirectly oppose a second element. In a case in which a third element intervenes between the first and second element, the first and second element may be understood as being indirectly opposed to one another, although still facing each other.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

Figure 2:
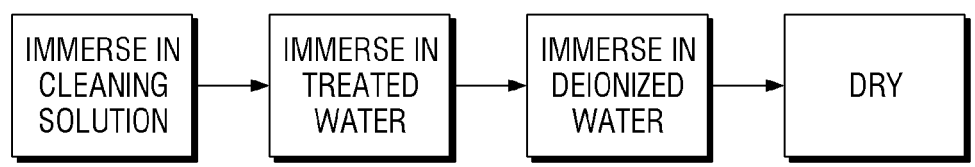
FIG. 2 is a flowchart illustrating a deposition mask cleaning method according to an embodiment.

FIG. 1 is a schematic cross-sectional view of a deposition mask cleaning apparatus 1 according to an embodiment. FIG. 2 is a flowchart illustrating a deposition mask cleaning method according to an embodiment.

Referring to FIG. 1, the deposition mask cleaning apparatus 1 may include a plurality of precipitation baths BTH_C, BTH_DW and BTH_OW in which all or part of a deposition mask MSK is immersed, and which contain different solutions for cleaning the deposition mask MSK.

The precipitation baths BTH_C, BTH_OW, and BTH_DW may include an organic solvent bath BTH_C, a treated water bath BTH_OW, and a deionized water bath BTH_DW.

Each of the organic solvent bath BTH_C, the treated water bath BTH_OW, and the deionized water bath BTH_DW may have an internal space with an open upper side, and a solution for cleaning the deposition mask MSK may be contained in the internal space. In FIG. 1, each of the organic solvent bath BTH_C, the treated water bath BTH_OW, and the deionized water bath BTH_DW may have a roughly rectangular shaped tank with an upper part opening upward in a cross section. However, the embodiments are not limited thereto.

The deposition mask MSK may be sequentially immersed and taken out from the organic solvent bath BTH_C, the treated water bath BTH_OW, and the deionized water bath BTH_DW according to the order of the deposition mask cleaning method. Although not illustrated, the deposition mask cleaning apparatus 1 may further include a part for transferring the deposition mask MSK, for example, an automatic transfer device including a jig (or a cassette) on which the deposition mask MSK is mounted and a jig movement part which moves the jig. The deposition mask MSK will be described in detail in FIGS. 3 and 4.

A cleaning solution may be contained in the organic solvent bath BTH_C. The cleaning solution may include a material capable of dissolving an organic material remaining on the deposition mask MSK, for example, an organic solvent capable of dissolving or peeling off organic matter, such as N-methyl pyrrolidone (NMP), acetone, or cyclohexanone.

Treated water may be contained in the treated water bath BTH_OW. The treated water may include a solution for cleaning the deposition mask MSK, such as hydrogen water, ammonia hydrogen water, or carbonated water. For example, ozone contained in ozone water may be easily decomposed into oxygen molecules and oxygen atoms because it has high energy. Since the oxygen atoms have strong oxidizing power, they may oxidize an organic material remaining on the deposition mask MSK, thereby cleaning the deposition mask MSK.

The treated water may contain bubbles having a size of several nanometers to several hundred micrometers, for example, a size of about 500 µm or less. For example, the bubbles may be microbubbles having a bubble diameter of about 50 µm or less and/or nanobubbles having a bubble diameter of about 1 nm to less than about 1 µm. For another example, the bubbles may include at least one of macrobubbles having a bubble diameter of about 102 µm to about 104 µm, microbubbles having a bubble diameter of about 10 µm to about 102 µm, sub-microbubbles having a bubble diameter of about 1 µm to about 10 µm, and nano-ultrafine bubbles having a bubble diameter of about $10^{-3}$ µm to about 1 µm. However, the size of the bubbles is not limited to the above examples.

The bubbles supplied into the treated water may have a relatively uniform size. Only one type of bubbles may be supplied into the treated water from among various types of bubbles such as the macrobubbles, the microbubbles, the sub-microbubbles, and the nano-ultrafine bubbles. However, the embodiments are not limited thereto, and two or more types of bubbles having different sizes may also be simultaneously supplied in mixture into ozone water. In other embodiments, the bubbles may be sequentially supplied into the ozone water.

Bubbles having a relatively large size, for example, the macrobubbles and the microbubbles may be attached to positively charged foreign matter, thereby raising the foreign matter. Bubbles having a relatively small size, for example, the sub-microbubbles and the nano-ultrafine bubbles may decompose an organic material by exploding in the water. Each bubble may perform a different role, thereby further maximizing cleaning power.

The bubbles may have high internal pressure due to surface tension, and vibration waves may be generated by repetition of contraction due to tension and expansion due to the internal pressure. The bubbles themselves may be negatively charged. Accordingly, a repulsive force may act between the bubbles.

The bubbles may be attached to positively charged, fine foreign matter floating in the water to gradually raise the foreign matter to the water surface. The bubbles may have a very slow rising rate, for example, a rising rate of about 1 mm to about 3 mm per minute, but the embodiments are not limited thereto.

The bubbles may collapse by exploding in the water and instantaneously raise the temperature to about 5,000° C. and produce almost infinitely high pressure. Surrounding water molecules may decompose to form free radicals such as OH. An organic material on the deposition mask MSK contacting the bubbles and may be decomposed by the high temperature, high pressure, and free radicals formed by the collapsing bubbles. Due to the collapsing bubbles, a treatment gas such as ozone, hydrogen or carbonic acid in the bubbles may be dissolved in the water. The cleaning action of the bubbles and ozone in the ozone water may maximize the cleaning power for cleaning the deposition mask MSK.

Deionized water may be contained in the deionized water bath BTH_DW. The deionized water may refer to water from which ions have been removed as much as possible using a cation or basic ion exchange resin. A chemical material such as the cleaning solution remaining on the deposition mask MSK may be rinsed with the deionized water. Although not illustrated, a stirrer for forming a water flow may be disposed in the deionized water bath BTH_DW.

Although not illustrated, at least one of the organic solvent bath BTH_C, the treated water bath BTH_OW, and the deionized water bath BTH_DW may further include an ultrasonic generation device which improves the cleaning power through the action of negative pressure.

The deposition mask cleaning apparatus 1 may further include a drying device DRD which dries the deposition mask MSK.

The drying device DRD may dry the deposition mask MSK by vaporizing a volatile organic material such as moisture or alcohol remaining on the deposition mask MSK. The drying device DRD may be implemented as, but not limited to, an air injector such as an air knife.

The organic solvent bath BTH_C, the treated water bath BTH_OW, the deionized water bath BTH_DW, and the drying device DRD may be arranged in one direction, for example, in a horizontal direction along the movement path of the deposition mask MSK in the order of, for example, the organic solvent bath BTH_C, the treated water bath BTH_OW, the deionized water bath BTH_DW, and the drying device DRD. However, the embodiments are not limited thereto, and the arrangement order of the organic solvent bath BTH_C, the treated water bath BTH_OW, the deionized water bath BTH_DW, and the drying device DRD may vary according to the cleaning order of the deposition mask MSK. For example, the baths may be arranged in the order of the organic solvent bath BTH_C, the deionized water bath BTH_DW, and the treated water bath BTH_OW. In other embodiments, the order may be the treated water bath BTH_OW, the organic solvent bath BTH_C, and the deionized water bath BTH_DW.

Referring to FIGS. 1 and 2, cleaning the deposition mask MSK may include immersing the deposition mask MSK in a cleaning solution, immersing the deposition mask MSK in treated water, immersing the deposition mask MSK in deionized water, and drying the deposition mask MSK. The cleaning of the deposition mask MSK may be performed by the deposition mask cleaning apparatus 1.

The deposition mask MSK may be immersed in a cleaning solution of the organic solvent bath BTH_C. Foreign matter on the deposition mask MSK may be peeled off and dissolved by the cleaning solution. The foreign matter may include organic matter and may be a deposition material deposited on the deposition mask MSK by a deposition process of an organic layer, for example, an organic light emitting layer or an organic insulating layer constituting a display panel. The deposition mask MSK may be immersed in the cleaning solution of the organic solvent bath BTH_C two or more times to improve the cleaning effect. However, the embodiments are not limited thereto. In some embodiments, the immersing of the deposition mask MSK in the cleaning solution may be replaced by an operation of spraying the cleaning solution to the deposition mask MSK.

The deposition mask MSK may be taken out from the organic solvent bath BTH_C and immersed in treated water of the treated water bath BTH_OW. As described above, the treated water may be, but is not limited to, at least one of ozone water, hydrogen water, ammonia hydrogen water, and carbonated water.

The foreign matter remaining on the deposition mask MSK without being completely cleaned by the cleaning solution may be removed by a dissolved gas such as ozone, hydrogen, ammonia hydrogen or carbonic acid dissolved in the treated water and the bubbles. The deposition mask MSK may be initially cleaned by the cleaning solution of the organic solvent bath BTH_C and then cleaned again by the treated water and bubbles of the treated water bath BTH_OW. The deposition mask MSK may be immersed in the treated water of the treated water bath BTH_OW two or more times to improve the cleaning effect. However, the embodiments are not limited thereto. In some embodiments, the immersing of the deposition mask MSK in the treated water may be replaced by an operation of spraying the treated water containing the bubbles onto the deposition mask MSK.

The deposition mask MSK may be taken out from the treated water bath BTH_OW and immersed in deionized water of the deionized water bath BTH_DW. The deposition mask MSK cleaned by the cleaning solution and the ozone water may be rinsed with the deionized water. The cleaning solution and foreign matter remaining on the deposition mask MSK may be removed by the deionized water. In some embodiments, the immersing of the deposition mask MSK in the deionized water may be replaced by an operation of spraying the deionized water to the deposition mask MSK.

The deposition mask MSK may be taken out from the deionized water bath BTH_DW and dried by the drying device DRD.

Figure 3:
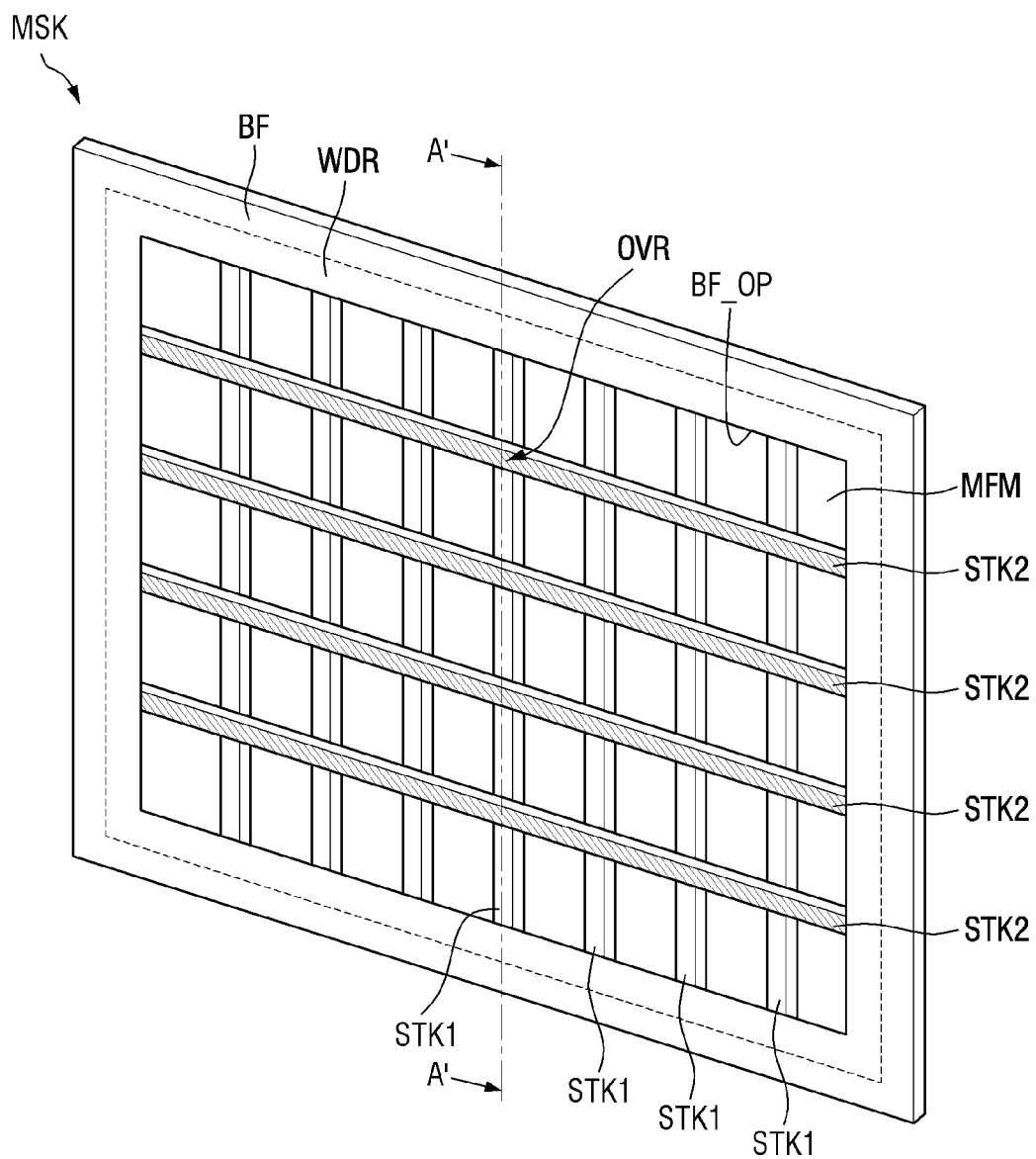
FIG. 3 is a schematic perspective view of a deposition mask according to an embodiment.
Figure 4:
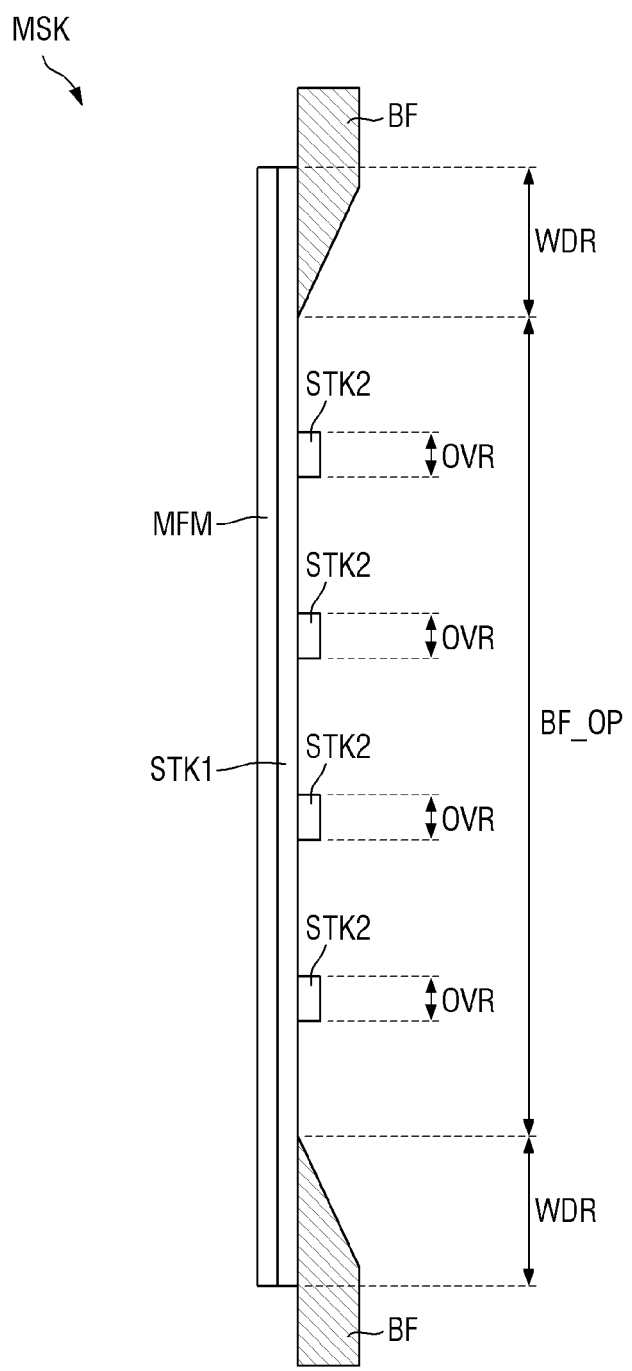
FIG. 4 is a schematic cross-sectional view taken along A-A' of FIG. 3.

The deposition mask MSK may be a mask for a deposition process for forming at least one of multiple layers constituting the display panel. The shape and material of the deposition mask MSK and the size of holes through which a deposition material passes may vary according to the shape or placement of a layer to be formed. For example, the deposition mask MSK may include a mask for forming at least one of an organic light emitting layer, an organic insulating layer and an organic encapsulation layer of the display panel. The deposition mask may include a fine metal mask (FMM) or an open mask. In FIGS. 3 and 4, a deposition mask MSK used in a deposition process for forming the organic light emitting layer of the display panel to which an organic light emitting element is applied is illustrated as an example. However, the type or shape of the deposition mask MSK is not limited thereto.

FIG. 3 is a schematic perspective view of a deposition mask MSK according to an embodiment. FIG. 4 is a schematic cross-sectional view taken along A-A' of FIG. 3.

Referring further to FIGS. 3 and 4, the deposition mask MSK may be formed as a thin plate having a roughly rectangular shape, but the embodiments are not limited thereto. The deposition mask MSK may be made of a metal material. For example, the metal material may include at least one of stainless steel and invar. The deposition mask MSK may include multiple small and dense holes for inducing a deposition material to be deposited at a desired position. The deposition mask MSK may be an FMM used for deposition of a light emitting organic material of an organic light emitting display panel.

The deposition mask MSK may include a frame part BF, first stick parts STK1, second stick parts STK2, and a metal film part MFM.

The frame part BF may be disposed along edges of the deposition mask MSK to form an opening BF_OP. The frame part BF may surround the first stick parts STK1, the second stick parts STK2, and the metal film part MFM.

The first stick parts STK1 and the second stick parts STK2 may be disposed across the opening BF_OP of the frame part BF. The first stick parts STK1 and the second stick parts STK2 may be disposed in the opening BF_OP of the frame part BF to form, for example, a grid pattern. As illustrated in FIG. 4, the ends of each of the first stick parts STK1 may overlap the frame part BF in a thickness direction, for example, in the horizontal direction of FIG. 4. Although not illustrated, the ends of each of the second stick parts STK2 may also overlap the frame part BF. Both ends of each of the first stick parts STK1 and both ends of each of the second stick parts STK2 may be disposed on the frame part BF. The frame part BF may have a greater thickness than the first stick parts STK1 and the second stick parts STK2, and the first stick parts STK1 and the second stick parts STK2 may have a greater thickness than the metal film part MFM. However, the embodiments are not limited thereto.

The first stick parts STK1 and the second stick parts STK2 may disposed across the metal film part MFM. The first stick parts STK1 and the second stick parts STK2 may prevent the metal film part MFM from sagging.

The first stick parts STK1 and the second stick parts STK2 may extend in directions intersecting each other. Each of the first stick parts STK1 may extend in one direction, for example, in a vertical direction, and each of the second stick parts STK2 may extend in the other direction intersecting the above direction, for example, in the horizontal direction.

The metal film part MFM may cover the opening BF_OP of the frame part BF. Fine holes through which a deposition material passes may be formed in the metal film part MFM. Most of the metal film part MFM may be disposed on the first stick parts STK1 and the second stick parts STK2. The metal film part MFM may overlap the first stick parts STK1 and the second stick parts STK2 in the thickness direction. The edges of the metal film part MFM may overlap the frame part BF in the thickness direction.

The deposition mask MSK may further include a joining region WDR in which the first stick parts STK1, the second stick parts STK2, the metal film part MFM, and the frame part BF are joined together.

The joining region WDR may surround the opening BF_OP of the frame part BF. Both ends of each of the first stick parts STK1, both ends of each of the second stick parts STK2, and the edges of the metal film part MFM, all of which overlap the frame part BF, may be welded to the frame part BF, and thus connected and joined to the frame part BF. The joining region WDR may be a region in which the first stick parts STK1, the second stick parts STK2, and the metal film part MFM are welded to the frame part BF.

However, the embodiments are not limited thereto, and the first stick parts STK1 and the second stick parts STK2 may also be connected to the frame part BF by a separate joining member or adhesive member, and the joining region WDR may be a region where the joining member or the adhesive member is disposed.

The deposition mask MSK may further include a plurality of overlap regions OVR in which the first stick parts STK1 and the second stick parts STK2 overlap each other.

The overlap regions OVR may be disposed in the opening BF_OP of the frame part BF. The overlap regions OVR may be formed by the first stick parts STK1 and the second stick parts STK2 intersecting each other in different directions.

As illustrated in FIGS. 3 and 4, the joining region WDR and the overlap regions OVR of the deposition mas MSK may have a structure that may be difficult for liquids, such as deposition materials or cleaning solution on the deposition mask MSK, to be easily discharged or to permeate into the deposition mask MSK. Accordingly, foreign matter, such as a deposition material, may remain on the deposition mask MSK and cause defects in a display panel manufactured using the deposition mask MSK.

To prevent such defects, the solubility of the organic solvent in a cleaning solution may be increased, until solubility of the solvent is saturated. However, increasing the solubility of the organic solvent may reduce the cleaning power, increase process costs by using such organic solvents, and increase difficulty of maintenance operations, such as contamination prevention.

The deposition mask cleaning apparatus 1 and the deposition mask cleaning method according to an embodiment described below may improve the cleaning power, reduce the process costs, and facilitate maintenance by applying the treated water bath BTH_OW in which treated water containing bubbles (or fine bubbles) is provided.

Figure 5:
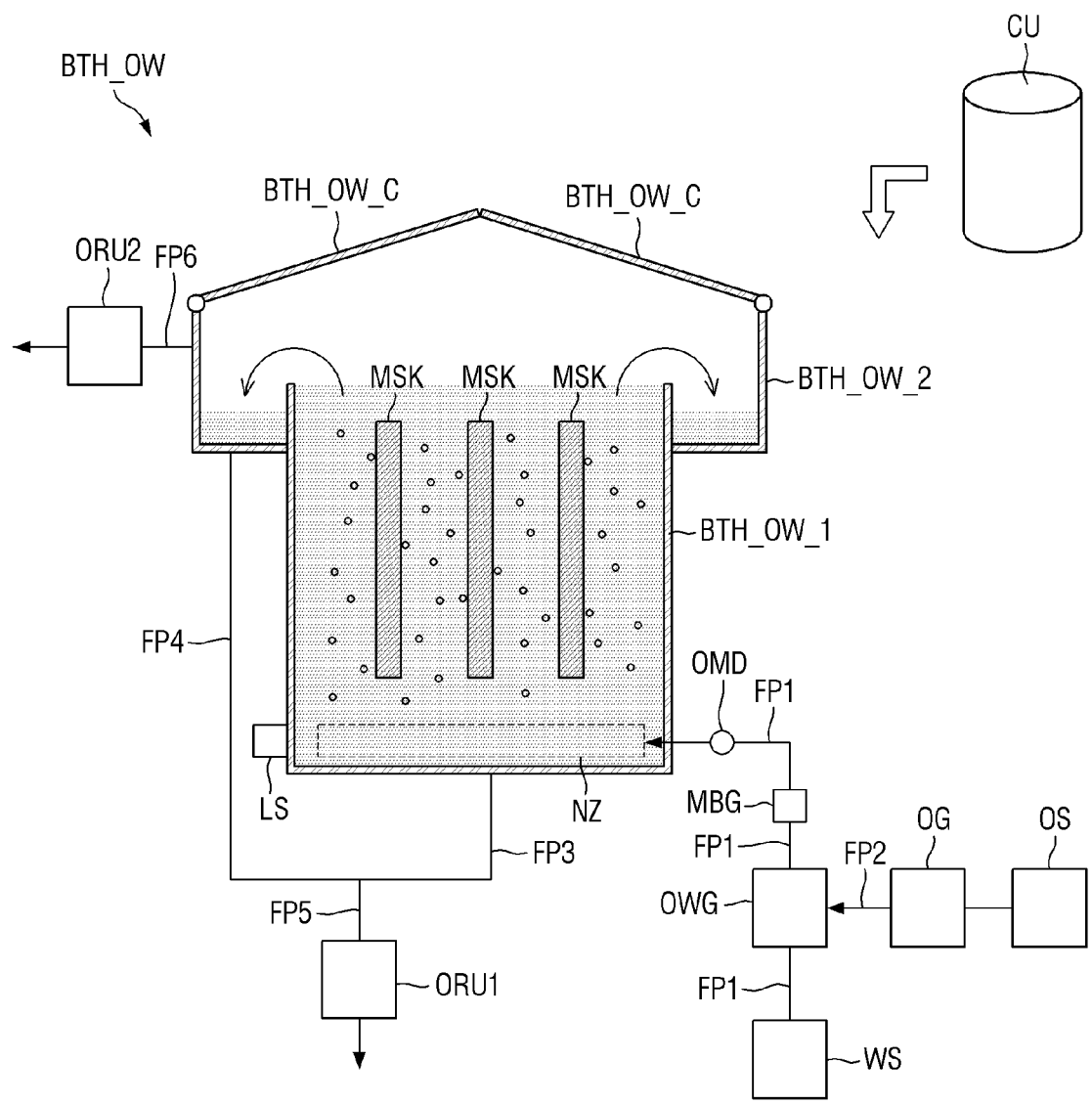
FIG. 5 is a schematic cross-sectional view of a treated water bath according to an embodiment.

FIG. 5 is a schematic cross-sectional view of a treated water bath BTH_OW according to an embodiment.

Referring further to FIG. 5, the treated water bath BTH_OW may include a treatment bath BTH_OW_1 and an outer bath BTH_OW_2.

The treatment bath BTH_OW_1 may have an internal space having an upper part open upward and recessed downward. Ozone water may be stored in the internal space.

The outer bath BTH_OW_2 may be disposed above the treatment bath BTH_OW_1. The outer bath BTH_OW_2 may surround the upper part of the treatment bath BTH_OW_1. Treated water overflowing from the upper part of the treatment bath BTH_OW_1 may flow into the outer bath BTH_OW_2. The treated water flowing into the outer bath BTH_OW_2 may be discharged to the outside through a second contaminant removal part ORU2 to be described later.

The deposition mask cleaning apparatus 1 may further include a deionized water supply part WS, a treated water generation part OWG, a treatment gas generation part OG, a precursor gas supply part OS, a bubble generation part MBG, a nozzle NZ, a first contaminant removal part ORU1, the second contaminant removal part ORU2, a treated water supply pipe FP1, a treatment gas supply pipe FP2, a treatment bath outlet pipe FP3, an outer bath outlet pipe FP4, a treated water outlet pipe FP5, and a treatment gas outlet pipe FP6.

The deionized water supply part WS may supply deionized water to the treated water generation part OWG. In an embodiment, the deionized water supply part WS may be connected to the nozzle NZ in the treatment bath BTH_OW_1 by the treated water supply pipe FP1.

The treated water generation part OWG may be provided in the treated water supply pipe FP1. The treated water generation part OWG may supply treated water to the treated water bath BTH_OW. As described above, the treated water may include, but is not limited to, at least one of ozone water, hydrogen water, ammonia hydrogen water, and carbonated water.

The treated water generation part OWG may be connected to the treatment gas generation part OG by the treatment gas supply pipe FP2 and may be connected to the deionized water supply part WS by the treated water supply pipe FP1. The treated water generation part OWG may generate the treated water by mixing the deionized water supplied from the deionized water supply part WS through the treated water supply pipe FP1 and a treatment gas supplied from the treatment gas generation part OG through the treatment gas supply pipe FP2. The treatment gas may include, but is not limited to, ozone gas, hydrogen gas, or carbonic acid gas. Although not illustrated, when the treated water includes ammonia hydrogen water, the treated water generation part OWG may include an ammonia addition part.

For example, the treated water generation part OWG may include a mixing part such as a gas-liquid mixing device for mixing the deionized water and the treatment gas. However, the embodiments are not limited thereto, and the treated water generation part OWG may also generate the treated water on its own by electrolyzing the deionized water passing through it without supply of a separate treatment gas. The treatment gas generation part OG may generate a treatment gas by decomposing a precursor gas supplied from the precursor gas supply part OS. For example, the treatment gas generation part OG may receive oxygen from the precursor gas supply part OS and generate an ozone gas through an electrolysis method in which plasma discharge is performed between two electrodes to pass oxygen. However, the embodiments are not limited thereto. In some embodiments, the precursor gas supply part OS may be omitted.

The precursor gas supply part OS may supply a high-concentration precursor gas, for example, oxygen, to the treatment gas generation part OG. The precursor gas supply part OS may include an oxygen supply part such as an oxygen compression cylinder. The high-concentration oxygen may be generated through, for example, a pressure circulation adsorption method in which nitrogen and oxygen in the air are separated using compressed air and an adsorbent, but the embodiments are not limited thereto.

The bubble generation part MBG may be provided in the treated water supply pipe FP1. The deionized water may be supplied into the treatment bath BTH_OW_1 from the deionized water supply part WS sequentially through the treated water generation part OWG and the bubble generation part MBG. The bubble generation part MBG may generate bubbles in the treated water passing through it. For example, the bubble generation part MBG may generate bubbles using various methods such as a pressurization method in which a sufficient amount of gas is dissolved in a solution by applying high pressure and then is passed through a porous permeable membrane by applying additional pressure, a shear method in which a liquid and a gas are forcibly mixed using a screw, or a venturi form is used or a shear swirling method in which a venturi form is used, but fine bubbles are generated by generating a shear vortex with air in the form of small particles in a chamber that sucks air, a decompression method in which a solution is made into a saturated solution by applying pressure to a gas contained in the solution at low temperature and then is rapidly heated or reduced in pressure, a cavitation method in which ultrafine bubbles are generated by vaporizing a liquid or causing a gas dissolved in the liquid to come out by applying energy such as ultrasonic waves or high-frequency waves to the liquid, and a gas-liquid mixing method in which ultra-fine bubbles are generated using irregular fluid flows generated by a device such as a bubble column, a mechanically agitated vessel, an in-line static mixer, or an ejector.

In FIG. 5, the treated water generation part OWG and the bubble generation part MBG are illustrated as separate elements. However, the embodiments are not limited thereto, and the treated water generation part OWG and the bubble generation part MBG may also be implemented as one device.

The nozzle NZ may be disposed in the internal space of the treatment bath BTH_OW_1. The nozzle NZ may be connected to the treated water supply pipe FP1 and may evenly spread the bubbles in the treated water into the treatment bath BTH_OW_1. In cross section, the nozzle NZ may be disposed adjacent to a bottom surface of the internal space of the treatment bath BTH_OW_1. When a deposition mask MSK is immersed, the nozzle NZ may be located under the deposition mask MSK. However, the embodiments are not limited thereto, and the nozzle NZ may also be disposed on a side surface of the internal space of the treatment bath BTH_OW_1. In some embodiments, the nozzle NZ may be omitted.

The first contaminant removal part ORU1 may remove contaminants, for example, ozone, from the treated water discharged from the treatment bath BTH_OW_1 and the outer bath BTH_OW_2. In an embodiment, the treated water of the treatment bath BTH_OW_1 may be discharged through the treatment bath outlet pipe FP3, the treated water of the outer bath BTH_OW_2 may be discharged through the outer bath outlet pipe FP4, and the first contaminant removal part ORU1 may be disposed in the treated water outlet pipe FP5, into which the treatment bath outlet pipe FP3 and the outer bath outlet pipe FP4 merge, to remove ozone from the treated water passing through it and discharge deionized water from which the contaminants have been removed to the outside. For example, when the treated water is ozone water, the first contaminant removal part ORU1 may include, for example, a device that stores the ozone water and removes ozone by bubbling the stored ozone water or an ozone removal part such as an ozone removal filter. However, the embodiments are not limited thereto. In some embodiments, deionized water from which ozone has been removed may be reused through filtering.

The second contaminant removal part ORU2 may remove contaminants from a gas discharged from the treated water bath BTH_OW. The second contaminant removal part ORU2 may be disposed in the treatment gas outlet pipe FP6 connected to the outer bath BTH_OW_2. In an embodiment, the second contaminant removal part ORU2 may remove contaminants from a gas existing in a space formed by the treatment bath BTH_OW_1, the outer bath BTH_OW_2, and a cover part BTH_OW_C to be described below and may discharge the gas to the outside. For example, when the treated water is ozone water, the second contaminant removal part ORU2 may include an ozone removal part such as an ozone removal filter using activated carbon, but the embodiments are not limited thereto.

The deposition mask cleaning apparatus 1 may further include a level sensor LS. The level sensor LS may sense the level of the treated water in the treatment bath BTH_OW_1. A control part CU may appropriately adjust the level of the treated water based on the sensed level of the treated water. In FIG. 5, the level sensor LS is disposed outside the treatment bath BTH_OW_1. However, the embodiments are not limited thereto, and the level sensor LS may also be disposed inside the treatment bath BTH_OW_1.

The deposition mask cleaning apparatus 1 may further include a concentration measurement part OMD.

The concentration measurement part OMD may be disposed in the treated water supply pipe FP1. The concentration measurement part OMD may measure the concentration of a treatment material or a treatment gas such as ozone, hydrogen, ammonia, or carbonic acid dissolved in the treated water passing through it.

The concentration measurement part OMD may be disposed between the treated water generation part OWG and the treatment bath BTH_OW_1. In an embodiment, the treated water generation part OWG, the bubble generation part MBG, and the concentration measurement part OMD may be sequentially disposed in the treated water supply pipe FP1 from an ozone water supply part to the treatment bath BTH_OW_1. However, the embodiments are not limited thereto, and the position of the concentration measurement part OMD and the position of the bubble generation part MBG may also be switched.

The deposition mask cleaning apparatus 1 may further include the cover part BTH_OW_C.

The cover part BTH_OW_C may cover an open upper part of the outer bath BTH_OW_2 to form a space surrounded by the treatment bath BTH_OW_1, the outer bath BTH_OW_2, and the cover part BTH_OW_C. The cover part BTH_OW_C may prevent contaminants produced during a cleaning process performed using the treated water from spreading to the outside. The cover part BTH_OW_C may open and close. For example, the cover part BTH_OW_C may be closed while the deposition mask MSK is being immersed or cleaned and may be opened before the deposition mask MSK is immersed and after the cleaning of the deposition mask MSK is completed. The cover part BTH_OW_C may be implemented in various ways such as at least one of a hinge door and a sliding door.

The deposition mask cleaning apparatus 1 may further include the control part CU.

The control part CU may control the overall operation of the deposition mask cleaning apparatus 1. The control part CU may control at least one of the deionized water supply part WS, the treated water generation part OWG, the treatment gas generation part OG, the precursor gas supply part OS, the bubble generation part MBG, the nozzle NZ, the first contaminant removal part ORU1, the second contaminant removal part ORU2, the level sensor LS, and the concentration measurement part OMD. For example, the control part CU may control the bubble generation part MBG to generate bubbles during a cleaning process. For another example, the control part CU may control a valve provided in the treatment bath outlet pipe FP3 to adjust the level of the treated water in the treatment bath BTH_OW_1 based on the water level sensed by the level sensor LS. For another example, the control part CU may control the concentration of the treatment material and/or the treatment gas in the treated water supply pipe FP1 based on the concentration of the treatment material and/or the treatment gas measured by the concentration measurement part OMD. For another example, the control part CU may control the opening and closing of the cover part BTH_OW_C. However, the operation of the control part CU is not limited to the above examples and may include all operations required for cleaning the deposition mask MSK with reference to other descriptions in the specification.

Referring to FIGS. 1 through 5, as described above, after being put into the organic solvent bath BTH_C, the deposition mask MSK may be put into the treated water bath BTH_OW.

After being cleaned by a cleaning solution, the deposition mask MSK may be transferred to above the treated water bath BTH_OW, and the cover part BTH_OW_C may be opened. After the cover part BTH_OW_C is opened, the deposition mask MSK may be immersed in the treated water of the treatment bath BTH_OW_1 through the open upper part of the treatment bath BTH_OW_1. Foreign matter including organic material on the deposition mask MSK may be cleaned by the treatment gas and/or the treatment material dissolved in the treated water and bubbles (or fine bubbles).

As described above, the deposition mask cleaning apparatus 1 and the deposition mask cleaning method using the same according to the embodiment use treated water containing bubbles (or fine bubbles). Therefore, it is possible to significantly improve the cleaning power, reduce the treatment cost, and facilitate maintenance as compared with when only a cleaning solution is used.

Figure 6:
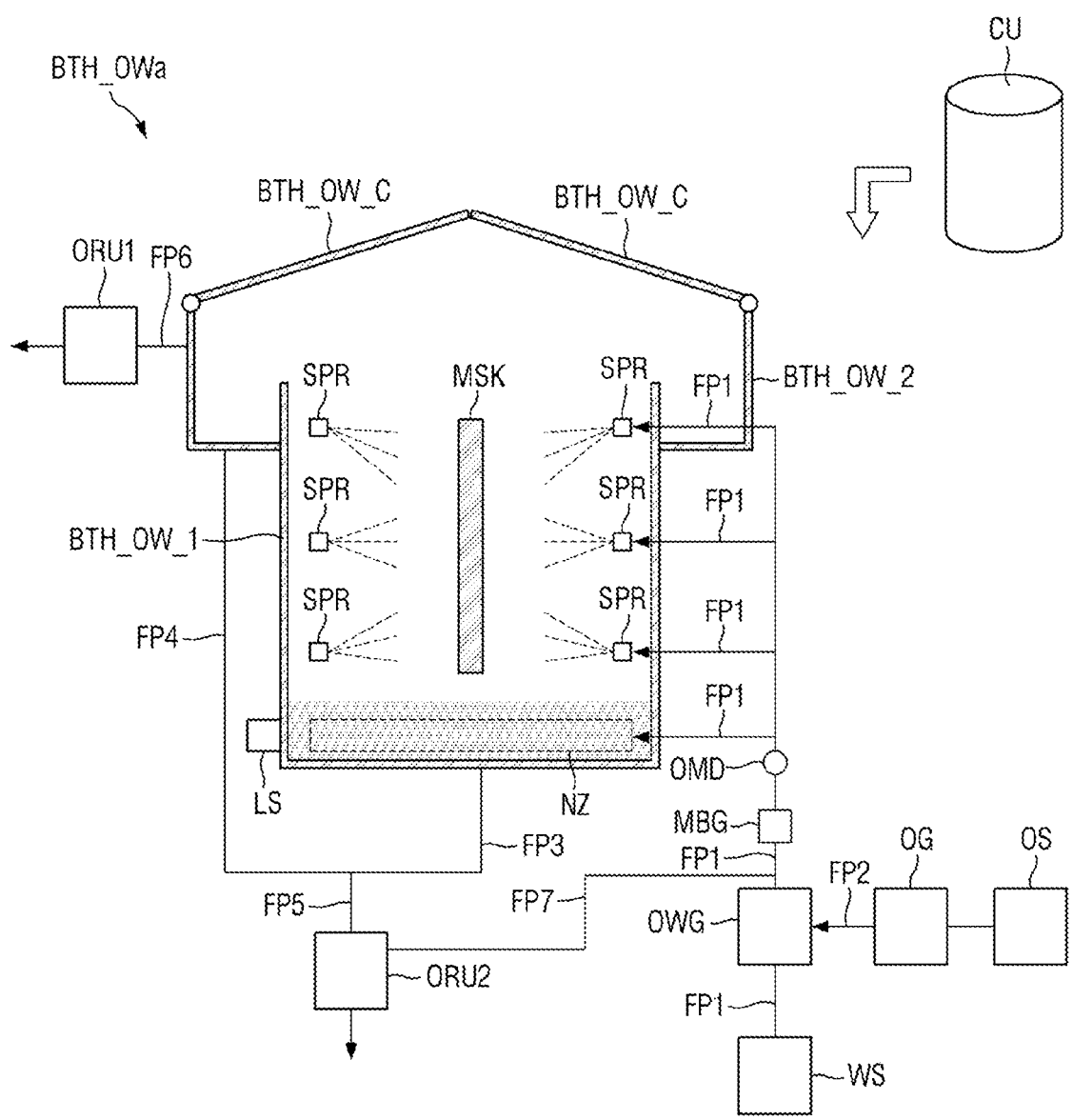
FIG. 6 is a schematic cross-sectional view of a treated water bath according to an embodiment.
Figure 7:
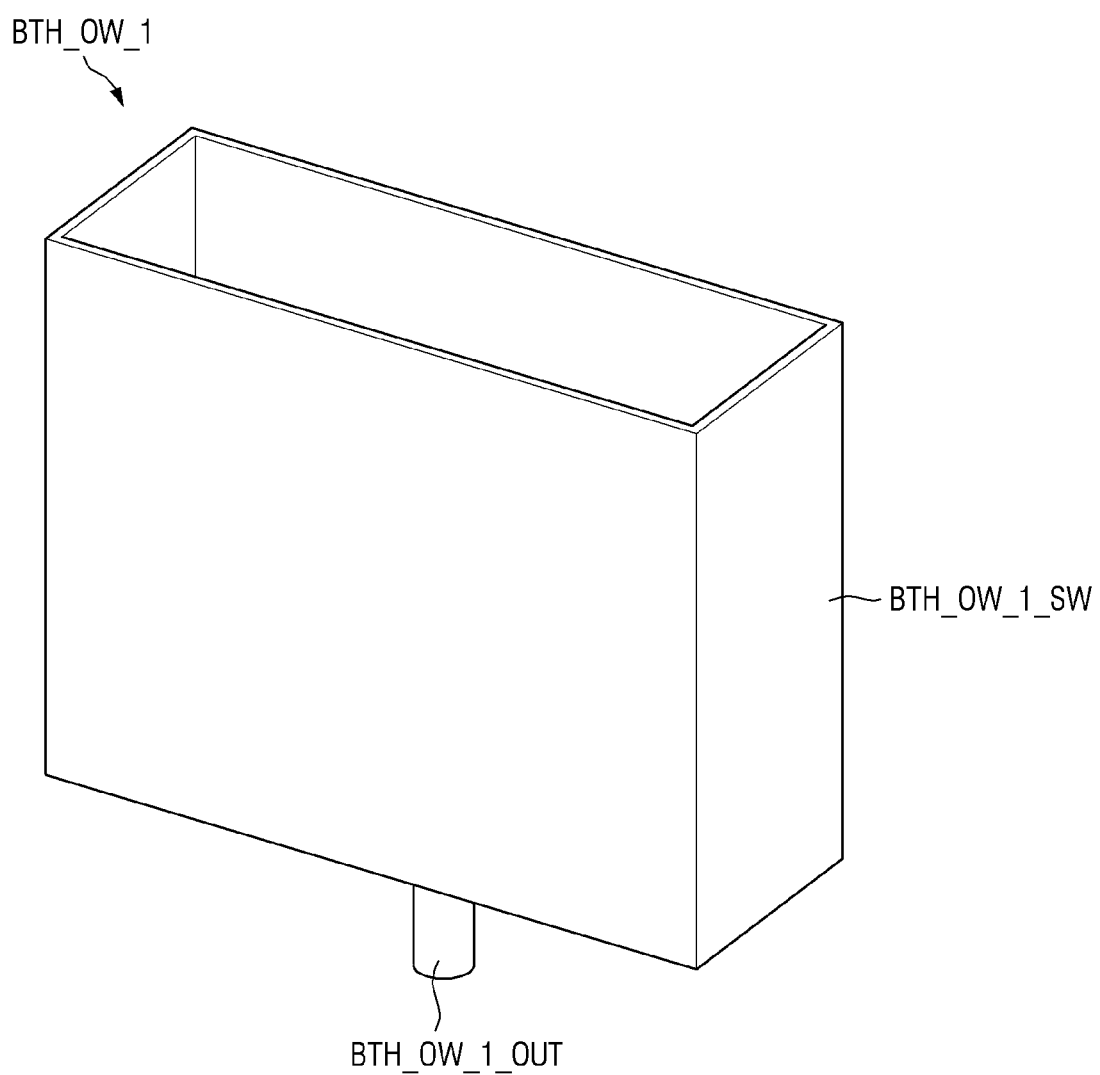
FIG. 7 is a schematic perspective view of a treatment bath of FIG. 6.
Figure 8:
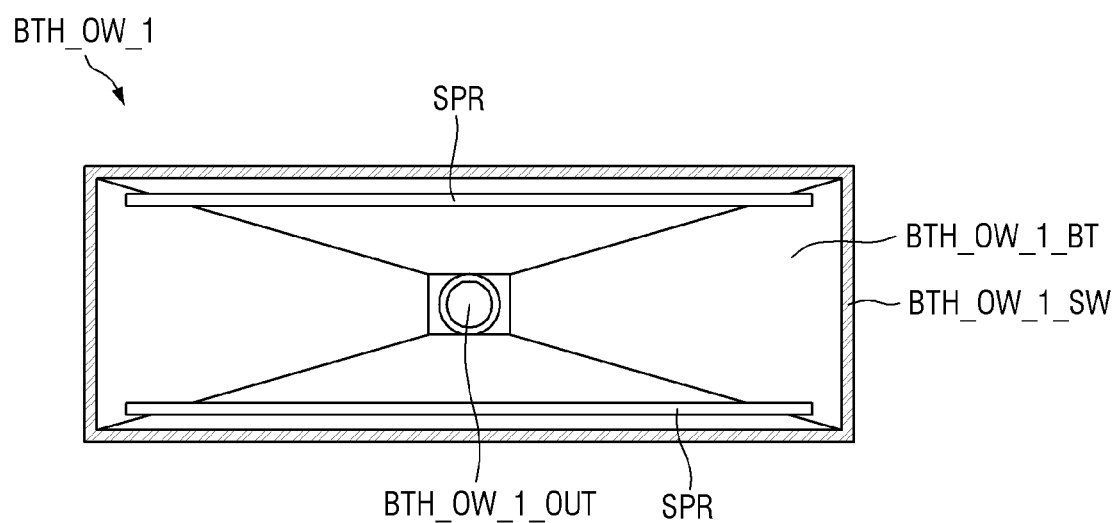
FIG. 8 is a schematic plan view of the treatment bath of FIG. 6.

FIG. 6 is a schematic cross-sectional view of a treated water bath according to an embodiment. FIG. 7 is a schematic perspective view of a treatment bath of FIG. 6. FIG. 8 is a schematic plan view of the treatment bath BTH_OW_1 of FIG. 6.

Referring to FIG. 6, the treated water bath BTH_OWa may further include a spray part SPR.

The spray part SPR may be disposed in the treatment bath BTH_OW_1. The spray part SPR may be connected to a treated water supply pipe FP1 and may spray treated water containing bubbles (or fine bubbles) into the treatment bath BTH_OW_1. As described above, the treated water may include at least one of ozone water, hydrogen water, ammonia hydrogen water, and carbonated water. When the treated water is sprayed to a deposition mask MSK using the spray part SPR, the use of the treated water can be reduced as compared with when the deposition mask MSK is immersed.

Multiple spray parts SPR may be disposed in the treatment bath BTH_OW_1. The spray parts SPR may be disposed adjacent to side surfaces which extend in the vertical direction and form an internal space of the treatment bath BTH_OW_1.

As illustrated in FIG. 6, the spray parts SPR may be disposed on a first side surface which forms the internal space of the treatment bath BTH_OW_1 and a second side surface facing the first side surface. For example, as illustrated in FIG. 6, a group of spray parts SPR may be arranged in a height direction on the first side surface of the treatment bath BTH_OW_1, and another group of spray parts SPR may be arranged in the height direction on the second side surface facing the first side surface of the treatment bath BTH_OW_1.

The spray parts SPR may be arranged at intervals in the height direction so that the treated water can be evenly sprayed to the deposition mask MSK. For example, the spray parts SPR may be disposed on an upper part of the first side surface and an upper part of the second side surface, a middle part of the first side surface, a lower part of the first side surface, a middle part of the second side surface, and a lower part of the second side surface, respectively. However, the number and arrangement of the spray parts SPR are not limited thereto. For example, two spray parts SPR may be disposed only on the upper part of the first side surface and the upper part of the second side surface of the treatment bath BTH_OW_1.

Referring further to FIGS. 7 and 8, the treatment bath BTH_OW_1 may include a roughly rectangular body part BTH_OW_1_SW which has an open upper side and an outlet BTH_OW_1_OUT which is disposed at the bottom of the body part BTH_OW_1_SW and connected to a treated water outlet pipe FP3. As illustrated in FIG. 8, a bottom surface BTH_OW_1_BT of an internal space of the body part BTH_OW_1_SW may be composed of a plurality of inclined surfaces sloping toward the outlet BTH_OW_1_OUT, but the embodiments are not limited thereto.

As illustrated in FIG. 8, the body part BTH_OW_1_SW may have a roughly rectangular shape having both long sides and both short sides in a plan view. The spray parts SPR may extend along both long sides of the body part BTH_OW_1_SW, respectively, and may be disposed in the internal space of the body part BTH_OW_1_SW to be adjacent to both long sides.

Referring again to FIG. 6, the treated water supply pipe FP1 may branch into multiple sub-treated water supply pipes FP11, and the sub-treated water supply pipes FP11 may be connected to at least one spray part SPR and a nozzle NZ, respectively. The nozzle NZ and a sub-treated water supply pipe FP11 connected to the nozzle NZ may be omitted.

A concentration measurement part OMD and a bubble generation part MBG may be disposed in the treated water supply pipe FP1 between the sub-treated water supply pipes FP11 and a treated water generation part OWG. However, the embodiments are not limited thereto. Although not illustrated, multiple concentration measurement parts OMD and multiple bubble generation parts MBG may also be disposed in the sub-treated water supply pipes FP11, and the concentration of a treatment gas (treatment material) in the treated water and the generation of bubbles may be precisely controlled.

When the spray parts SPR and the nozzle NZ are disposed together in the treatment bath BTH_OW_1, the deposition mask cleaning apparatus 1 may be operated to be switchable between an immersion mode and a spray mode. In the immersion mode, enough treated water may be supplied into the treatment bath BTH_OW_1 to immerse and clean part of or all of the deposition mask MSK as illustrated in FIG. 5. In the spray mode, the deposition mask MSK is cleaned by the treated water sprayed from the spray parts SPR in the treatment bath BTH_OW_1 as illustrated in FIG. 6.

In the immersion mode, a plurality of deposition masks MSK may be put into the treatment bath BTH_OW_1. The control part CU may adjust at least one of a flow rate of the treated water supply pipe FP1, a flow rate of the sub-treated water supply pipes FP11, a flow rate of the treatment bath outlet pipe FP3, and a flow rate of an outer bath outlet pipe FP4 based on the level of the treated water in the treatment bath BTH_OW_1 measured by a level sensor LS, so that the deposition masks MSK can be entirely or partially immersed. For example, although not illustrated, a flow rate control part such as a valve may be provided in at least one of the treated water supply pipe FP1, the sub-treated water supply pipes FP11, the treatment bath outlet pipe FP3 and the outer bath outlet pipe FP4, and the control part CU may control the flow rate of the treated water supply pipe FP1, the flow rate of the treatment bath outlet pipe FP3, and the flow rate of the outer bath outlet pipe FP4 by controlling the flow rate control part.

In the immersion mode, the treated water may be supplied only to the sub-treated water supply pipe FP11 connected to the nozzle NZ and may not be supplied to the sub-treated water supply pipes FP11 connected to the spray parts SPR. Accordingly, the treated water may not be sprayed from the spray parts SPR. However, the embodiments are not limited thereto. In the immersion mode, the treated water may also be supplied to the spray parts SPR. In this case, since the treated water flows out through the spray parts SPR even though the spray parts SPR are immersed in the treated water, bubbles can be scattered relatively uniformly in the treatment bath BTH_OW_1.

In the spray mode, one deposition mask MSK may be put into the treatment bath BTH_OW_1, but the embodiments are not limited thereto. The control part CU may adjust at least one of the flow rate of the treated water supply pipe FP1, the flow rate of the sub-treated water supply pipes FP11, the flow rate of the treatment bath outlet pipe FP3, and the flow rate of the outer bath outlet pipe FP4 based on the level of the treated water in the treatment bath BTH_OW_1 measured by the level sensor LS, so that the deposition mask MSK is not immersed. For example, the level of the treated water may be adjusted by the flow rate control part. Ozone water sprayed toward the deposition mask MSK may be collected by falling to the bottom of the treatment bath BTH_OW_1 and may be discharged to the outside through the treatment bath outlet pipe FP3.

By switching between modes as described above, the deposition mask cleaning apparatus 1 can flexibly respond to process changes, save installation space, and reduce process cost and maintenance cost.

Referring to FIG. 6, the deposition mask cleaning apparatus 1 may further include a recirculation pipe FP7 which collects the treated water flowing out of the treatment bath BTH_OW_1 and supplies the collected treated water back to the treated water supply pipe FP1.

An end of the recirculation pipe FP7 may be connected to a treated water outlet pipe FP5, and the other end of the recirculation pipe FP7 may be connected to the treated water supply pipe FP1. The other end of the recirculation pipe FP7 may be connected to the treated water supply pipe FP1 between the bubble generation part MBG and the treated water generation part OWG. However, the embodiments are not limited thereto. An end of the recirculation pipe FP7 may also be connected to the outer bath outlet pipe FP4 or the treatment bath outlet pipe FP3, and the other end of the recirculation pipe FP7 may be connected between the treatment bath BTH_OW_1 and the concentration measurement part OMD or between the concentration measurement part OMD and the bubble generation part MBG. Although not illustrated, the recirculation pipe FP7 may also be applied to the embodiments of FIGS. 5 and 14.

The deposition mask cleaning apparatus 1 may be operated in at least one of an open mode in which the treated water used in the treatment bath BTH_OW_1 or an outer bath BTH_OW_2 is discharged to the outside and a closed mode in which the treated water is recirculated and reused. The deposition mask cleaning apparatus 1 may also be operated in a combination of the open mode and the closed mode. The above operation may be controlled by the control part CU, the recirculation pipe FP7, and at least one flow control part, for example, a valve disposed in pipes connected to the recirculation pipe FP7. For example, in the open mode, the treated water sprayed into the treatment bath BTH_OW_1 may be discharged to the outside through the treatment bath outlet pipe FP3, the treated water outlet pipe FP5, and a second contaminant removal part ORU2. In the closed mode, the treated water collected in the treatment bath BTH_OW_1 may be supplied back to the treated water supply pipe FP1 through the recirculation pipe FP7 connected to the treated water outlet pipe FP5.

The embodiment of FIGS. 6 through 8 is substantially similar to the embodiment of FIGS. 1 through 5 except for the configuration of the treated water bath BTH_OWa, and thus descriptions of the same components will not be repeated.

Figure 9:
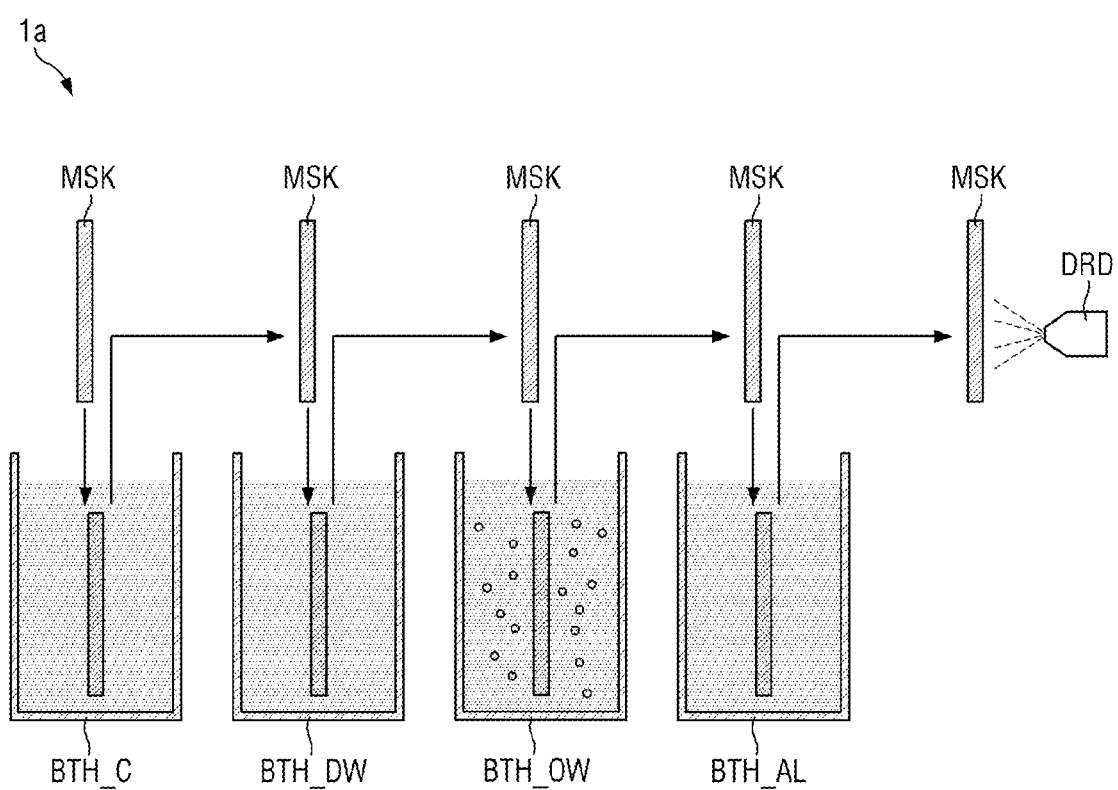
FIG. 9 is a schematic cross-sectional view of a deposition mask cleaning apparatus according to an embodiment.
Figure 10:
FIG. 10 is a flowchart illustrating a deposition mask cleaning method according to an embodiment.

FIG. 9 is a schematic cross-sectional view of a deposition mask cleaning apparatus according to an embodiment. FIG. 10 is a flowchart illustrating a deposition mask cleaning method according to an embodiment.

Referring to FIG. 9, the deposition mask cleaning apparatus 1*a* may include a plurality of precipitation baths BTH_C, BTH_DW, BTH_OW and BTH_AL, and the precipitation baths BTH_C, BTH_DW, BTH_OW and BTH_AL may further include a volatile organic solvent bath BTH_AL.

The volatile organic solvent bath BTH_AL may contain a volatile organic solvent. The volatile organic solvent may include, for example, a solvent having a lower boiling point than water, such as benzene, toluene, xylene, acetone, or alcohol (isopropyl alcohol). Water, for example, deionized water, remaining on a deposition mask MSK may be replaced by the volatile organic solvent and thus rapidly dried.

The precipitation baths BTH_C, BTH_DW, BTH_OW and BTH_AL of the deposition mask cleaning apparatus 1*a* may be arranged in a different order according to a cleaning process. As illustrated in FIG. 9, the precipitation baths BTH_C, BTH_DW, BTH_OW and BTH_AL may be arranged in the order of an organic solvent bath BTH_C, a deionized water bath BTH_DW, a treated water bath BTH_OW, and the volatile organic solvent bath BTH_AL. The deposition mask MSK may be sequentially put into the organic solvent bath BTH_C, the deionized water bath BTH_DW, the treated water bath BTH_OW, and the volatile organic solvent bath BTH_AL in this order. In some embodiments, the deionized water bath BTH_DW may be omitted. In some embodiments, the deionized water bath BTH_DW may be disposed between the treated water bath BTH_OW and the volatile organic solvent bath BTH_AL.

As described above, bubbles (or fine bubbles) may be provided to the treated water of the treated water bath BTH_OW. The treated water bath BTH_OW may include spray parts SPR, as illustrated in FIG. 6. In an embodiment, the treated water bath BTH_OW may not include spray parts SPR, as illustrated in FIG. 5. As described above, when the spray parts SPR are disposed, the treated water bath BTH_OW may be operated only in a spray mode or may be selectively operated in an immersion mode or a spray mode.

Referring further to FIG. 10, cleaning the deposition mask MSK may include immersing the deposition mask MSK in a cleaning solution, immersing the deposition mask MSK in deionized water, immersing the deposition mask MSK in treated water, immersing the deposition mask MSK in alcohol (a volatile organic solvent), and then drying the deposition mask MSK.

First, the deposition mask MSK may be immersed in a cleaning solution of the organic solvent bath BTH_C. Foreign matter on the deposition mask MSK may be peeled off and dissolved by the cleaning solution. In some embodiments, the immersing of the deposition mask MSK in the cleaning solution may be replaced by an operation of spraying the cleaning solution to the deposition mask MSK.

The deposition mask MSK may be taken out from the organic solvent bath BTH_C and immersed in deionized water of the deionized water bath BTH_DW. The cleaning solution remaining on the deposition mask MSK may be rinsed with the deionized water. In some embodiments, the immersing of the deposition mask MSK in the deionized water may be omitted. In some embodiments, the immersing of the deposition mask MSK in the deionized water may be performed between an operation of immersing the deposition mask MSK in ozone water (or treated water) and an operation of immersing the deposition mask MSK in a volatile organic solvent.

The deposition mask MSK may be taken out from the deionized water bath BTH_DW and immersed in treated water of the treated water bath BTH_OW. As described above, the treated water may include at least one of ozone water, hydrogen water, ammonia hydrogen water, and carbonated water. For example, the treated water may be ozone water, and the foreign matter remaining on the deposition mask MSK may be cleaned once more by ozone in the ozone water and bubbles (or fine bubbles). In some embodiments, the immersing of the deposition mask MSK in the treated water may be replaced by an operation of spraying the treated water to the deposition mask MSK.

The deposition mask MSK may be taken out from the treated water bath BTH_OW and immersed in a volatile organic solvent of the volatile organic solvent bath BTH_AL.

The deposition mask MSK may be taken out from the volatile organic solvent bath BTH_AL and may be dried by a drying device DRD or may be naturally dried.

The cleaning order of the deposition mask MSK may vary according to the required cleaning power, the type of cleaning solution, the cleaning power of the treated water and bubbles, and the foreign matter on the deposition mask MSK.

The embodiment of FIGS. 9 and 10 is substantially similar to the embodiment of FIGS. 1 through 5 except for the configuration of the precipitation baths BTH_C, BTH_DW, BTH_OW and BTH_AL and the cleaning process, and descriptions of the same components will not be repeated.

Figure 11:
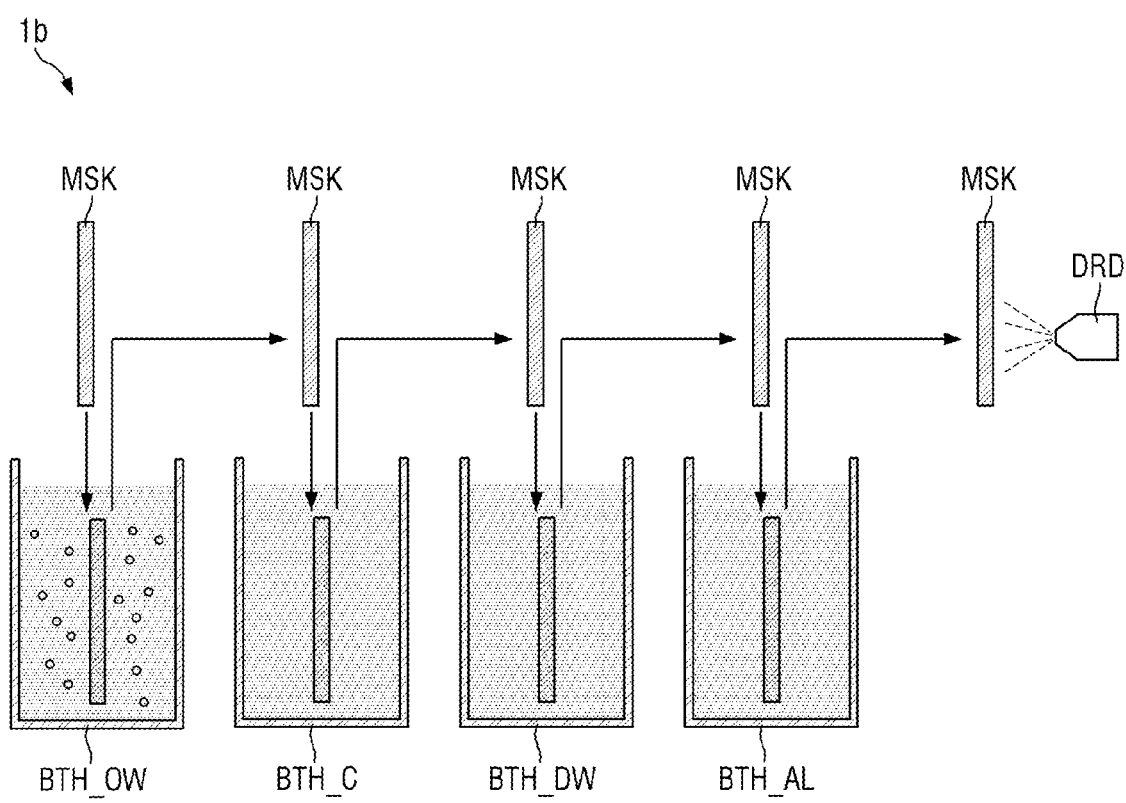
FIG. 11 is a schematic cross-sectional view of a deposition mask cleaning apparatus according to an embodiment.
Figure 12:
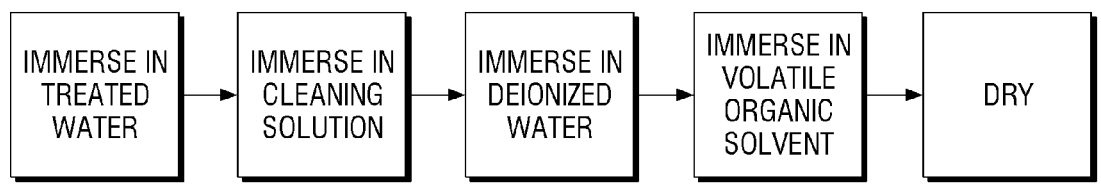
FIG. 12 is a flowchart illustrating a deposition mask cleaning method according to an embodiment.

FIG. 11 is a schematic cross-sectional view of a deposition mask cleaning apparatus according to an embodiment. FIG. 12 is a flowchart illustrating a deposition mask cleaning method according to an embodiment.

Referring to FIG. 11, the embodiment of FIG. 11 may further include a volatile organic solvent bath BTH_AL as in the embodiment of FIG. 9. However, the embodiment of FIG. 11 is different from the embodiment of FIG. 9 in the arrangement order of the precipitation baths BTH_C, BTH_DW, BTH_OW and BTH_AL.

As illustrated in FIG. 11, the precipitation baths BTH_C, BTH_DW, BTH_OW and BTH_AL may be arranged in the order of a treated water bath BTH_OW, an organic solvent bath BTH_C, a deionized water bath BTH_DW, and the volatile organic solvent bath BTH_AL. A deposition mask MSK may be sequentially put into the treated water bath BTH_OW, the organic solvent bath BTH_C, the deionized water bath BTH_DW, and the volatile organic solvent bath BTH_AL in this order. In some embodiments, the volatile organic solvent bath BTH_AL may be omitted.

Referring further to FIG. 12, cleaning the deposition mask MSK may include immersing the deposition mask MSK in treated water, immersing the deposition mask MSK in a cleaning solution, immersing the deposition mask MSK in deionized water, immersing the deposition mask MSK in a volatile organic solvent, and then drying the deposition mask MSK.

The deposition mask MSK may be immersed in treated water of the treated water bath BTH_OW. As described above, the treated water may include at least one of ozone water, hydrogen water, ammonia hydrogen water, and carbonated water. For example, when the treated water is ozone water, foreign matter remaining on the deposition mask MSK may be initially cleaned by ozone in the ozone water and bubbles (or fine bubbles). In some embodiments, the immersing of the deposition mask MSK in the treated water may be replaced by an operation of spraying the treated water to the deposition mask MSK.

The deposition mask MSK may be taken out from the treated water bath BTH_OW and immersed in a cleaning solution of the organic solvent bath BTH_C. The foreign matter remaining on the deposition mask MSK may be cleaned once more by the cleaning solution. In some embodiments, the immersing of the deposition mask MSK in the cleaning solution may be replaced by an operation of spraying the cleaning solution to the deposition mask MSK.

The deposition mask MSK may be taken out from the organic solvent bath BTH_C and immersed in deionized water of the deionized water bath BTH_DW. The foreign matter, cleaning solution and treated water remaining on the deposition mask MSK may be rinsed with the deionized water.

The deposition mask MSK may be taken out from the deionized water bath BTH_DW and immersed in a volatile organic solvent of the volatile organic solvent bath BTH_AL. In some embodiments, the immersing of the deposition mask MSK in the volatile organic solvent may be omitted.

The deposition mask MSK may be taken out from the volatile organic solvent bath BTH_AL and may be dried by a drying device DRD or may be naturally dried.

The embodiment of FIGS. 11 and 12 is substantially similar to the embodiment of FIG. 9 except for the arrangement order of the precipitation baths BTH_C, BTH_DW, BTH_OW and BTH_AL and the cleaning process, and descriptions of the same components will not be repeated.

Figure 13:
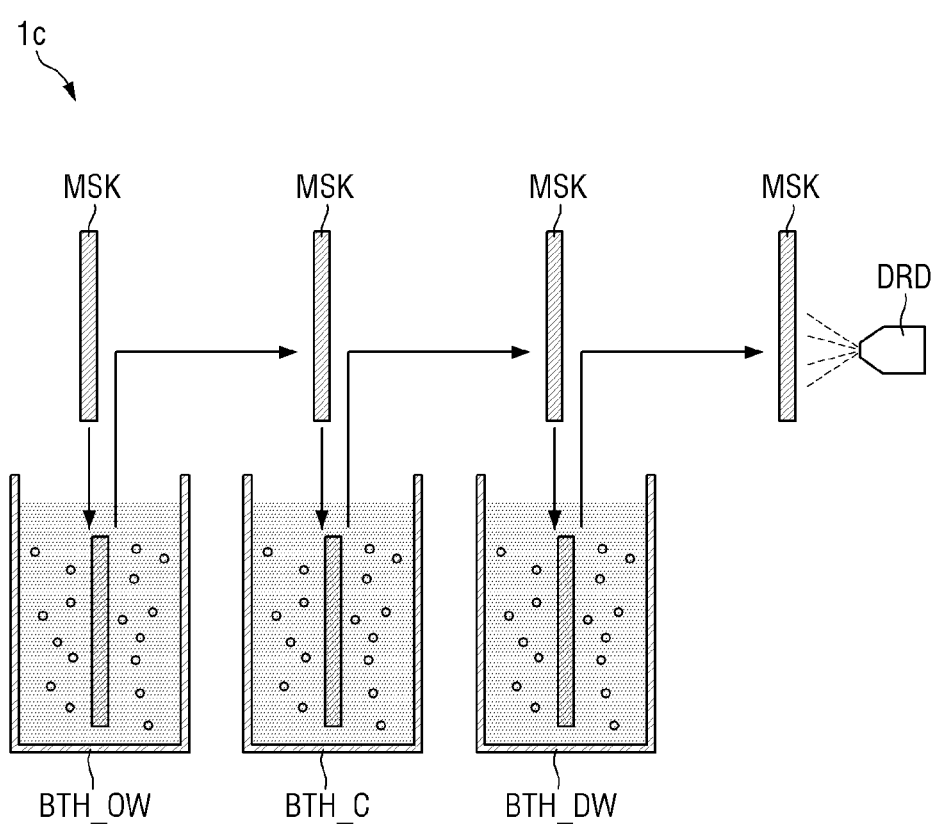
FIG. 13 is a schematic cross-sectional view of a deposition mask cleaning apparatus according to an embodiment.

FIG. 13 is a schematic cross-sectional view of a deposition mask cleaning apparatus according to an embodiment.

Referring to FIG. 13, the embodiment of FIG. 13 is different from the embodiment of FIGS. 1 through 5 in that bubbles (or fine bubbles) are also provided to the deionized water and a cleaning solution.

As illustrated in FIG. 13, bubbles substantially similar to the bubbles provided to treated water of a treated water bath BTH_OW may be provided to the deionized water in a deionized water bath BTH_DW and the cleaning solution in an organic solvent bath BTH_C. Accordingly, the cleaning power of the cleaning solution and the rinsing power of the deionized water may be improved. For example, the bubbles may have a size of about 10 nm to about 500 nm. For another example, the bubbles may include macrobubbles, microbubbles, sub-microbubbles, and nano-ultrafine bubbles. One type of bubbles having a relatively uniform size may be provided to the organic solvent bath BTH_C and the deionized water bath BTH_DW, or two or more types of bubbles having different sizes may be simultaneously or sequentially provided to the organic solvent bath BTH_C and the deionized water bath BTH_DW.

The bubbles in the cleaning solution and the bubbles in the deionized water may be provided in substantially the same or similar manner as the bubbles in the treated water. For example, although not illustrated, the organic solvent bath BTH_C and the deionized water bath BTH_DW may have substantially similar structures as the treated water baths BTH_OW illustrated in FIGS. 5 and 6 and FIG. 14. A deionized water supply part WS may be replaced by a cleaning solution supply part, and a precursor gas supply part OS and a treatment gas generation part OG may be omitted.

The embodiment of FIG. 13 is substantially the same as or similar to the embodiment of FIGS. 1 through 5 except that bubbles (or fine bubbles) are provided to the deionized water and the cleaning solution, and descriptions of similar components will not be repeated.

Figure 14:
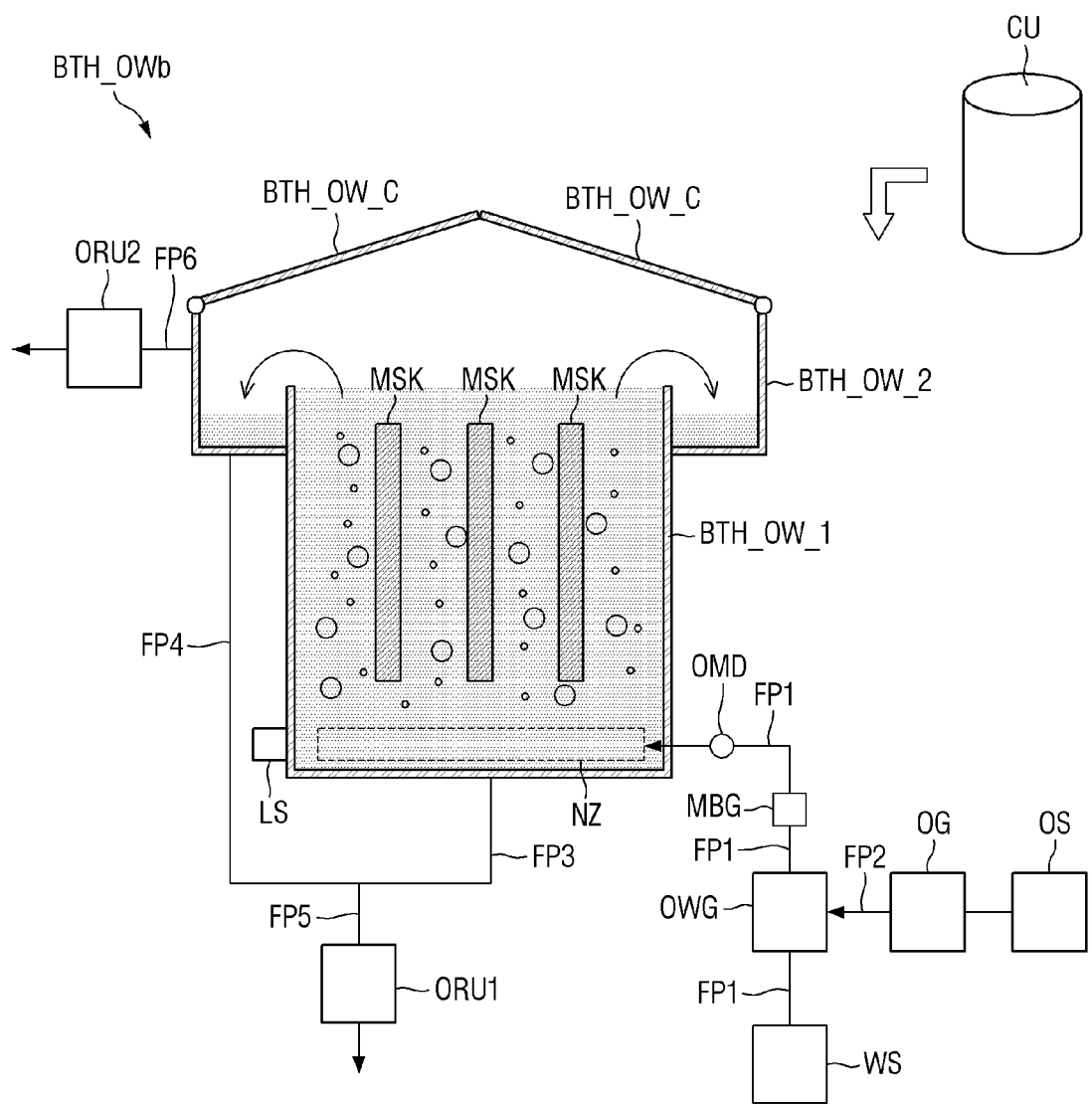
FIG. 14 is a schematic cross-sectional view of a deposition mask cleaning apparatus according to an embodiment.

FIG. 14 is a schematic cross-sectional view of a deposition mask cleaning apparatus 1 according to an embodiment.

Referring to FIG. 14, the embodiment of FIG. 14 is different from the embodiment of FIG. 5 in that different types of bubbles having different sizes are sequentially or simultaneously provided into the treated water bath BTH_OWb.

The types of bubbles and methods of generating bubbles according to the size of the bubbles are as described above with reference to FIGS. 1 through 5.

A bubble generation part MBG may generate one type of bubbles having a relatively uniform size by selectively applying any one of the methods described in FIG. 5 or may simultaneously or sequentially generate several types of bubbles having different sizes by simultaneously applying two or more methods.

For example, the bubble generation part MBG may generate only one type of bubbles among the macrobubbles, microbubbles, sub-microbubbles, and nano-ultrafine bubbles described above. In other embodiments, the bubble generation part MBG may simultaneously or sequentially generate two or more types of bubbles. The macrobubbles and the microbubbles may be generated by the pressurization method, the shear method, or the shear swirling method, and the sub-microbubbles and the nano-ultrafine bubbles may be generated by the decompression method, the cavitation method, or the gas-liquid mixing method. The overall operation of the bubble generation part MBG including the selection of the bubble size and/or the selection of the bubble generation method may be controlled by a control part CU.

In some embodiments, the bubble generation part MBG may further include a bubble size varying part or a bubble size varying device which varies the bubble size. For example, the bubble size varying part may be implemented by the various bubble generation methods described in FIG. 5 and a combination of devices for implementing the methods, but the embodiments are not limited thereto.

The control part CU may control the bubble generation part MBG to generate bubbles of a preset size according to a preset mode. The preset mode may include a single mode in which bubbles of a uniform size are supplied into a treatment bath BTH_OW_1 and a hybrid mode in which bubbles of different sizes are supplied into the treatment bath BTH_OW_1.

In the hybrid mode, the control part CU may control the bubble generation part MBG to generate two or more types of bubbles for a preset time. The type of bubbles and/or the size of bubbles may be variously varied. For example, the control part CU may control the bubble generation part MBG to simultaneously generate first bubbles of a first size and second bubbles of a second size different from the first size for a preset time. Further, the control part CU may control the bubble generation part MBG to simultaneously generate third bubbles of a third size different from the first size and the second size for the preset time. The first bubbles, the second bubbles, and the third bubbles may each be, but are not limited to, any one of macrobubbles, microbubbles, sub-microbubbles, and nano-ultrafine bubbles. For another example, the control part CU may control the bubble generation part MBG to generate the first bubbles for a first preset time and then generate the second bubbles for a second preset time different from the first preset time. Further, the control part CU may control the bubble generation part MBG to generate the third bubbles for a third preset time after the second bubbles are generated. Bubbles having various sizes may be sequentially or simultaneously supplied into the treatment bath BTH_OW_1. Therefore, cleaning of a deposition mask MSK may be optimized.

The embodiment of FIG. 14 is substantially similar to the embodiment of FIGS. 1 through 5 except that the bubble size is controlled, and descriptions of identical components will not be repeated.

A deposition mask cleaning apparatus and a deposition mask cleaning method according to an embodiment can effectively clean foreign matter remaining on a deposition mask.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A deposition mask cleaning apparatus comprising:
   a treated water bath containing treated water in which a deposition mask is immersed, the treated water bath comprising a treatment bath containing the treated water, an outer bath disposed above a bottom of the treatment bath, and a cover covering an upper part of the outer bath;

a treated water generation device fluidly connected to the treated water bath to provide treated water, the treated water contacting the deposition mask comprising at least one of ozone water, hydrogen water, ammonia hydrogen water, and carbonated water;

a treated water supply pipe connecting the treatment bath and the treated water generation device, an outer bath outlet pipe connected to the outer bath and configured to discharge the treated water from the outer bath;

a treatment gas outlet pipe connected to the outer bath and configured to discharge a gas discharged from the treatment bath to a space defined by the outer bath and the cover;

a level sensor disposed in the treated water bath and configured to measure the level of the treated water based on a sensed level of the treated water in the treated water bath;

a bubble generation device disposed in the treated water supply pipe to provide bubbles in the treated water; and a controller that regulates the level of the treated water in the treated water bath via the level sensor and a control valve, the controller further regulating the size and quantity of bubbles formed via the bubble generation device such that bubbles that contact the deposition mask and clean a portion of foreign matter from the deposition mask comprise both microbubbles having a bubble diameter of about 50 μm to 1 μm and nanobubbles having a bubble diameter of less than 1 μm, wherein the bubble generation device comprises a bubble size varying device connected to the controller, and the treated water bath includes a spray part that faces the deposition mask and is configured to spray treated water onto the deposition mask while the deposition mask is within the treatment bath but not immersed in liquid.

2. The deposition mask cleaning apparatus of claim 1, further comprising at least one of:
a nozzle disposed in the treated water bath and connected to the treated water supply pipe.

3. The deposition mask cleaning apparatus of claim 1, further comprising:
a deionized water supply device supplying deionized water to the treated water generation device;
a treatment gas generation device fluidly connected to the treated water generation device to provide a treatment gas; and
a concentration measurement device disposed in the treated water supply pipe and measuring the concentration of a treatment material in treated water flowing in the treated water supply pipe.

4. The deposition mask cleaning apparatus of claim 1, wherein
the bubbles comprise first bubbles of a first size greater than 1 μm, and second bubbles of a second size less than 1 μm, and
the first bubbles and the second bubbles are simultaneously supplied into the treated water bath.

5. The deposition mask cleaning apparatus of claim 1, wherein
the bubbles comprise first bubbles of a first size greater than 1 μm, and second bubbles of a second size less than 1 μm, and
the first bubbles and the second bubbles are sequentially supplied into the treated water bath.

6. The deposition mask cleaning apparatus of claim 5, wherein
the first bubbles are supplied into the treated water bath for a first time period, and
the second bubbles are supplied into the treated water bath for a second time period different from the first time period.

7. The deposition mask cleaning apparatus of claim 1, further comprising:
an organic solvent bath containing a cleaning solution; and
a deionized water bath containing deionized water.

8. The deposition mask cleaning apparatus of claim 7, wherein the treated water bath, the organic solvent bath, and the deionized water bath are sequentially arranged in the order of the organic solvent bath, the treated water bath, and the deionized water bath.

9. The deposition mask cleaning apparatus of claim 7, wherein the treated water bath, the organic solvent bath, and the deionized water bath are arranged in the order of the organic solvent bath, the deionized water bath, and the treated water bath.

10. The deposition mask cleaning apparatus of claim 7, wherein the treated water bath, the organic solvent bath, and the deionized water bath are arranged in the order of the treated water bath, the organic solvent bath, and the deionized water bath.

11. The deposition mask cleaning apparatus of claim 1, further comprising a volatile organic solvent bath which contains a volatile organic solvent.

12. The deposition mask cleaning apparatus of claim 1, wherein the deposition mask comprises:
a fine metal mask for manufacturing an organic light emitting display panel; and
an open mask for manufacturing an organic light emitting display panel.

13. The deposition mask cleaning apparatus of claim 1, wherein the deposition mask comprises:
a frame part including an opening;
first stick parts disposed across the opening of the frame part;
second stick parts disposed across the opening of the frame part and intersecting the first stick parts; and
a metal film part disposed on the first stick parts and the second stick parts, the metal film part covering the opening of the frame part.

14. The deposition mask cleaning apparatus of claim 1, wherein
treated water cleans another portion of the foreign matter from on the deposition mask, and
the foreign matter includes an organic material.

15. The deposition mask cleaning apparatus of claim 1, wherein
the deposition mask includes a first side, and a second side opposite the first side,
openings in the deposition mask extend from the first side to the second side, and
the spray part includes a plurality of first spray parts that face the openings in the deposition mask and spray treated water towards the first side of the deposition mask, and
the spray part includes a plurality of second spray parts that face the openings in the deposition mask and spray treated water towards the second side of the deposition mask.

* * * * *